(12) United States Patent
Kakoschke et al.

(10) Patent No.: US 7,679,963 B2
(45) Date of Patent: Mar. 16, 2010

(54) INTEGRATED CIRCUIT HAVING A DRIVE CIRCUIT

(75) Inventors: Ronald Kakoschke, Munich (DE); Thomas Nirschl, Essex Junction, VT (US); Doris Schmitt-Landsiedel, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 42 days.

(21) Appl. No.: 11/576,416

(22) PCT Filed: Jul. 8, 2005

(86) PCT No.: PCT/EP2005/053285

§ 371 (c)(1),
(2), (4) Date: Oct. 4, 2007

(87) PCT Pub. No.: WO2006/034887

PCT Pub. Date: Apr. 6, 2006

(65) Prior Publication Data

US 2008/0068895 A1    Mar. 20, 2008

(30) Foreign Application Priority Data

Sep. 30, 2004    (DE) .................. 10 2004 047 610

(51) Int. Cl.
*G11C 16/06*    (2006.01)

(52) U.S. Cl. ........................ 365/185.23; 365/185.13; 365/185.01; 365/177; 365/189.08

(58) Field of Classification Search ............ 365/185.23, 365/185.13, 185.01, 177, 189.09
See application file for complete search history.

(56) References Cited

U.S. PATENT DOCUMENTS

| 3,601,629 | A | | 8/1971 | Cricchi |
| 4,037,140 | A | | 7/1977 | Eaton, Jr. |
| 4,132,904 | A | * | 1/1979 | Harari .................. 365/185.07 |
| 4,969,019 | A | | 11/1990 | Banerjee |
| 5,300,835 | A | | 4/1994 | Assar et al. |
| 5,543,748 | A | | 8/1996 | Ando |
| 5,578,509 | A | * | 11/1996 | Fujita ......................... 438/286 |
| 5,898,606 | A | * | 4/1999 | Kobayashi et al. ............ 365/63 |
| 5,936,265 | A | | 8/1999 | Koga |
| 6,323,708 | B1 | | 11/2001 | Uemura |
| 6,700,817 | B2 | | 3/2004 | Atsumi et al. |
| 2006/0256609 | A1 | * | 11/2006 | Murakami et al. .......... 365/158 |
| 2006/0258072 | A1 | * | 11/2006 | Kavalieros et al. .......... 438/197 |

FOREIGN PATENT DOCUMENTS

| JP | 05029616 | 2/1993 |
| JP | 09162394 | 6/1997 |
| WO | 2004/001801 | 12/2003 |

* cited by examiner

*Primary Examiner*—Thong Q Le
(74) *Attorney, Agent, or Firm*—Dicke, Billig & Czaja, PLLC

(57) ABSTRACT

An intergrated circuit having a drive circuit is disclosed. One embodiment provides an intergrated memory circuit arrangement with a drive circuit for an EEPROM. In one embodiment, the drive circuit contains tunnel field effect transistors and can be produced in particular on a small chip area.

30 Claims, 4 Drawing Sheets

INTEGRATED CIRCUIT HAVING A DRIVE CIRCUIT

CROSS REFERENCE TO RELATED APPLICATION

This Utility Patent Application claims the benefit of the filing date of German Application No. 10 2004 047 610.1, filed Sep. 30, 2004, and International Application No. PCT/EP2005/053285, filed Jul. 8, 2005, both of which are herein incorporated by reference.

BACKGROUND

The invention relates to an integrated memory circuit arrangement containing a multiplicity of memory cells arranged in matrix-type fashion in rows and columns. Each memory cell contains at least one memory element. Moreover, a plurality of bit lines in each case lead to the memory cells of the same row. Drive circuits which in each case contain a plurality of drive transistors are arranged on the word lines.

The memory element is e.g., a floating gate transistor, a magnetoresistive memory element, a ferroelectric memory element, a memory element which stores the memory information as a phase (e.g., amorphous or crystalline), or some other memory element.

The drive circuits often contain components whose minimum dimensions are greater than the minimum feature size in the integrated memory circuit arrangement, in particular in comparison with the minimum feature size in the memory cell array. This is attributable e.g., to the fact that higher voltages have to be switched in the drive circuit. Particularly in memory cells which effect nonvolatile storage, drive voltages are required which often amount to a multiple of the operating voltage applied externally to the integrated circuit.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide an integrated circuit having a memory circuit arrangement which is constructed in a simple manner and which permits, in particular, a further miniaturization of drive circuits on word lines. Moreover, the intention is to specify associated uses.

The invention is based on the consideration that the physical limits of high-voltage transistors impede miniaturization. The invention therefore resorts to a different type of field effect transistors than standard field effect transistors having the same doping type in the source region and in the drain region. The invention utilizes special tunnel field effect transistors, which are similar in construction to conventional field effect transistors and whose drain region is doped in accordance with a different doping range than their source region. Such tunnel field effect transistors afford the possibility of maintaining drive circuits used hitherto essentially unchanged apart from miniaturization, or changing them only slightly, e.g., with regard to the doping type of specific doping regions or the replacement of a standard field effect transistor by two tunnel field effect transistors, where the two transistors, on account of a reduced area requirement of an individual transistor, also overall require only the same or even a smaller area than the transistor replaced. Even the voltage levels used hitherto for driving the transistors can be maintained. The tunnel field effect transistors are embodied as vertical field effect transistors or as horizontal field effect transistors.

Moreover, the invention is based on the consideration that the p-i-n structure (p-type doping, intrinsic doping, n-type doping) of the tunnel field effect transistors, on account of the i-type region, enable a higher breakdown voltage for the same channel lengths in comparison with standard field effect transistors. Instead of the intrinsic doping, a comparatively low n-type doping or a comparatively low p-type doping is also used for reasons of simpler production. Tunnel field effect transistors are therefore particularly suitable for circuits in which comparatively high voltages of greater than 5 volts, greater than 9 volts, greater than 12 volts or even greater than 15 volts are to be switched, wherein the voltages are less than 30 volts, however.

The special tunnel field effect transistor contained in a drive circuit according to the invention contains an electrically conductive control electrode which is isolated from a channel forming region by a dielectric. A first doped connection region, which is also referred to as source or drain region, is arranged at one end of the channel forming region. The first doped connection region is doped in accordance with a first doping type. A second doped connection region is arranged at the other end of the channel forming region, the connection region being doped in accordance with a doping type which differs from the first doped connection region. Thus, although the construction of the tunnel field effect transistor is very similar to the construction of a standard tunnel field effect transistor, there is also a significant difference on account of the different doping type in the drain region and in the source region.

In one development of the circuit arrangement according to the invention, the memory cells are memory cells which effect nonvolatile storage, that is to say memory cells which maintain their memory state even after an operating voltage has been switched off. However, the arrangement is not only restricted to nonvolatile memories, but can also be used for other memory types. The invention is used particularly at locations at which a high-voltage section has to be isolated from a low-voltage section. Particularly in the case of charge-storing layers, high voltages are required in order to introduce the charges into the charge-storing layer or to remove them from the charge-storing layer, wherein the charge-storing layer is either electrically conductive or electrically insulating. Tunneling currents which tunnel through a dielectric are used for writing to or erasing memory cells. As an alternative, in particular for writing, it is also possible to utilize other physical processes, e.g., "hot" charge carriers, that is to say highly accelerated charge carriers, which can likewise pass through the dielectric. The expression CHE (Channel Hot Electron) is also used in this context.

In developments, the tunnel field effect transistors are used in a bistable multivibrator (latch) or in a transmission gate. The transmission gate is a switching element which is used for bidirectional signal transmission or for electrically isolating a high-voltage circuit section from a low-voltage circuit section.

The invention additionally relates to the use of a tunnel field effect transistor, in particular of the abovementioned special tunnel field effect transistor, having a gate length of less than 500 nanometers or less than 300 nanometers for the switching of voltages of greater than 5 volts, 9 volts, 12 volts or 15 volts, but less than 30 volts, or for isolating circuit sections at which the aforethe voltages are present from circuit sections in which only voltages smaller in magnitude than the aforethe voltages are switched. A broad field of application for mass-produced products is thus opened up for the tunnel field effect transistors, e.g., for drive circuits in memory circuits.

Figure 1:
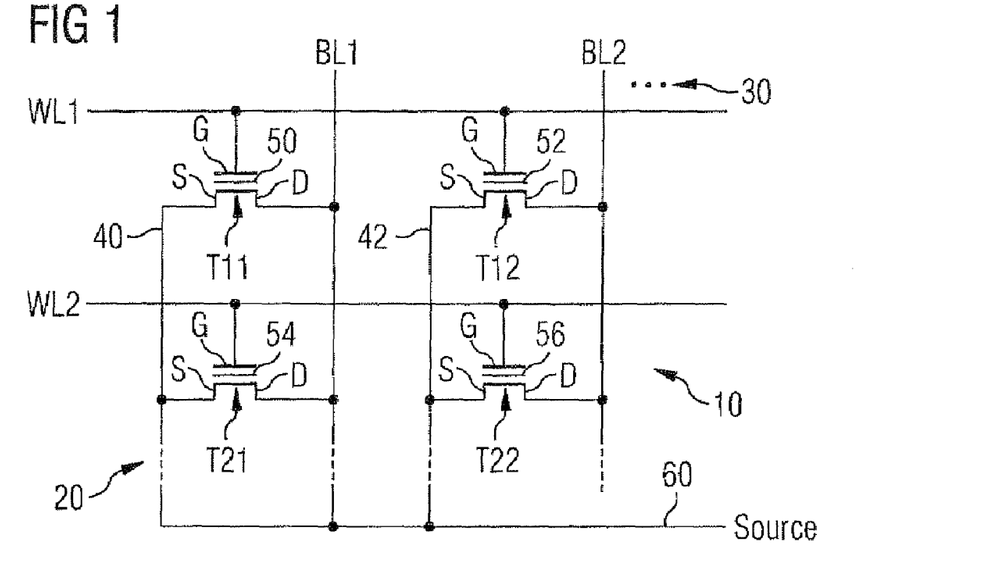
FIG. 1 illustrates a circuit diagram of a cell array in an integrated memory circuit arrangement.

FIG. 1 illustrates a circuit diagram of a cell array in an integrated memory circuit arrangement 10, e.g., a flash EEPROM. The memory cell array contains a multiplicity of memory transistors arranged in matrix-type fashion in horizontally running rows and vertically running columns, four memory transistors T11 to T22 of which are illustrated in FIG. 1. The first index for designating a memory cell specifies in each case the row in which the relevant memory cell is situated. The second index for designating a memory cell specifies the column in which the relevant memory cell is situated. Thus, the memory cell T12 lies in the first row and in the second column.

In the exemplary embodiment, each memory cell includes only one memory transistor T11 to T21. Other memory elements may also be used besides transistors. In other exemplary embodiments, by way of example, split-gate memory cells are used or memory cells are used which also contain an address transistor in addition to the memory transistor. The memory cells T11 to T21 are all constructed identically, and so only the construction of the memory cell T11 is explained below. The memory cell T11 contains a control electrode or gate electrode G, which is also referred to as control gate. Below the gate electrode G there is a floating gate 50 for storing charges. The floating gate 50 is electrically insulated from the gate electrode G. In the exemplary embodiment, the floating gate 50 is a layer composed of polycrystalline silicon.

In other exemplary embodiments, an ONO layer (Oxide-Nitride-Oxynitride) is used. The floating gate 50 is isolated from a channel forming region by a gate dielectric. The channel forming region is connected by a doped source region S and a doped drain region D. The memory transistors T12, T21 and T22 likewise contain floating gates 52, 54 and 56, respectively.

The gate electrodes G of memory transistors T11 to T22 which are arranged in one row of the matrix are connected to a word line WL1 or WL2, see for example the memory transistors T11 and T12 of the first row, the gate electrodes G of which are connected to the first word line WL1. Further horizontally running word lines 20 are indicated by dots.

The drain regions D of memory transistors T11 to T22 of a column of the memory matrix are in each case connected to a bit line BL1, BL2 running vertically in FIG. 1. By way of example, the drain regions D of the memory transistors T11 and T21 are connected to the first bit line BL1. Further bit lines 30 are represented by dots in FIG. 1.

The source regions S of the memory transistors T11 to T22 of a column of the matrix are in each case connected to a source line 40, 42, see for example the source line 40, to which the source regions S of the memory transistors T11 and T21 are connected. The source lines 40, 42 lead to a collective line 60, which is also referred to as a common source terminal.

Although a SNOR architecture is illustrated in the exemplary embodiment, the invention can also be applied to other architectures of nonvolatile memories, for example to a NAND structure, to a DINOR structure, etc. The bit lines BL1, BL2 are local bit lines which are connected to global bit lines via selection transistors. As an alternative, the bit lines BL1, BL2 are global bit lines. The source lines 40, 42 can also be connected to the common source line 60 via selection transistors (not illustrated). In one exemplary embodiment, the bit lines BL1, BL2 and the source lines 40, 42 are metal lines. In another exemplary embodiment, either the bit lines BL1, BL2 or the source lines 40, 42 are buried bit lines which are in each case arranged in a doped region. In a next alternative, both the bit lines BL1, BL2 and also the source lines 40, 42 are embodied as buried lines in a doped region in each case.

Figure 2:
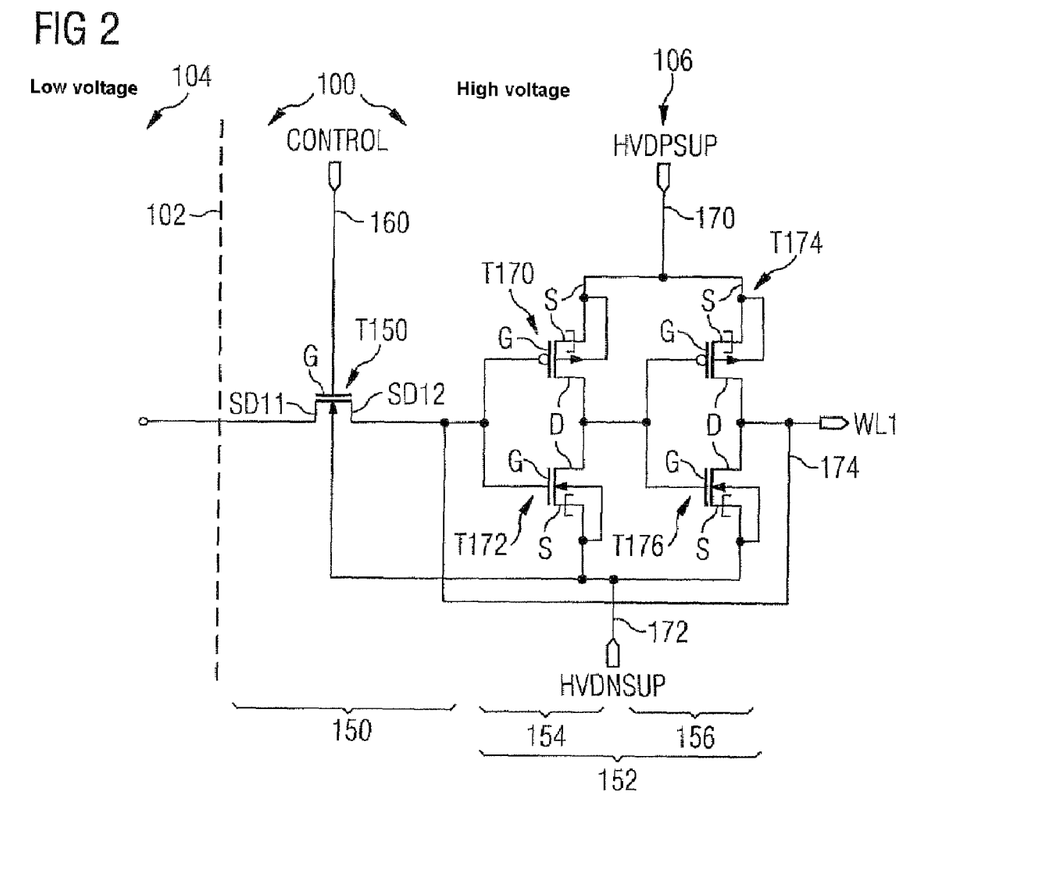
FIG. 2 illustrates a circuit diagram of a word line driver.

FIG. 2 illustrates a circuit diagram of a word line driver or a drive circuit 100. These drive circuits 100 are in each case situated on a word line WL1, WL2, etc. The drive circuit 100 illustrated in FIG. 2 is connected to the word line WL1.

The word line drivers serve together with the selection logic in the low-voltage section for the selection of a row of the memory cell array. The word line driver is additionally used for the charge reversal of the capacitive load of the word line. The drive circuits 100 switch positive high voltages (e.g., 16 volts) and negative high voltages (e.g., −12 volts) onto the word lines WL1, WL2 of the cell array of the memory circuit arrangement 10. The area requirement of the drive circuits is approximately 6.8% in the case of program memory circuit arrangements and even 25% of the total area of the memory circuit arrangement in the case of data memory circuit arrangements. The circuit described here involves the drive circuits 100 of a program memory module. The drive circuits 100 for the data memory are constructed according to the same principle, but differ somewhat in dimensioning from the drive circuits 100 for a program memory module.

The drive circuit 100 contains a low-voltage logic or a low-voltage section 104 on the left of a dashed line 102 and a high-voltage section 106 on the right of the dashed line 102. The low-voltage section 104 has the task of selecting the word line WL1, WL2 and of driving the high-voltage section 106.

The high-voltage section 106 contains a pass transistor T150 or a pass circuit 150 and also high-voltage latch 152, which is also referred to as a high-voltage driver. The transistor T150 is an n-channel field effect transistor which serves for isolating the high-voltage section 106 from the low-voltage section 104. The transistor T150 or the pass circuit 150 prevents the gate oxide from being able to break down in the case of the low-voltage transistors T100 to T132 on account of the high voltages in the high-voltage section 106. The gate electrode of the transistor T150 is connected to a control line 160, which carries a control signal (CONTROL). One operating path connection SD11 of the transistor T150 is connected to the output of the inverter 111. The other operating path connection SD12 of the transistor T150 leads to the high-voltage latch 152. The substrate region of the transistor T150 is also connected to the high-voltage latch 152, as will be explained in greater detail further below.

The high-voltage latch 152 includes two inverter circuits 154, 156 coupled with positive feedback, which switch the high voltage onto the word line WL1 and keep themselves at the necessary gate potential on account of the positive feedback. The inverter 154 contains a p-channel tunnel field effect transistor T170 and an n-channel tunnel field effect transistor T172. The operating paths of the transistors T170 and T172 are connected in series. A source region S and the substrate region of the transistor T170 are connected to a potential line 170 leading to a charge pump. The drain regions of the transistors T170 and T172 are electrically conductively connected to one another and lead to the input of the inverter 156. The substrate region of the transistor T172 and the source region of the transistor T172 are electrically conductively connected to a potential line 172 and the substrate region of the transistor T150. The potential line 172 likewise leads to a charge pump.

The gate electrodes G of the transistors T170 and T172 are electrically conductively connected to the operating path connection SD12 of the transistor T150 and also to a feedback line 174, which also leads to the word line WL1.

The inverter 156 likewise contains a p-channel tunnel field effect transistor T174 and an n-channel tunnel field effect transistor T176, the operating paths of which are in turn connected in series. A source region S of the transistor T174 and the substrate region of the transistor T174 are connected to the potential line 170. The drain region D of the transistor T174 is connected to the drain region D of the transistor T176 and also to the word line WL1 and the feedback line 174. The substrate region of the transistor T176 is connected to the source region S of the transistor T176 and also to the substrate region of the transistor T150. The gate electrodes G of the transistors T174 are connected to the input of the inverter 156 and thus to the drain regions D of the transistors T170 and T172.

On account of the construction of the high-voltage section 104, the high voltage can be switched without a voltage drop at the transistors T170 to T174. In the exemplary embodiment, the supply voltage is for example 1.8 volts (VDD) and for example 0 volts (VSS). The voltage of the control signal (CONTROL) is 7 volts, for example, in order to ensure a reliable switching of the pass transistor T150 or the pass circuit 150. The control line 160 (CONTROL) carries a global signal for all the word line drivers or drive circuits 100 of a sector, for example e.g., for all 256 word line drivers of a sector. Depending on whether the signal at the operating path connection SD11 is logic "0" or logic "1", the high-voltage latch 152 is set and then the positive high voltage (HVDPSUP) or negative high voltage (HVDNSUP) is driven up by the charge pumps being started.

The space saving of chip area in the drive circuits 100 is particularly great on account of the use of tunnel field effect transistors T170 to T176. However, a space saving is already achieved even if only one portion of the field effect transistors T170 to T176 are tunnel field effect transistors, while the other portion are field effect transistors having the same doping type in the source and drain regions.

Figure 3:
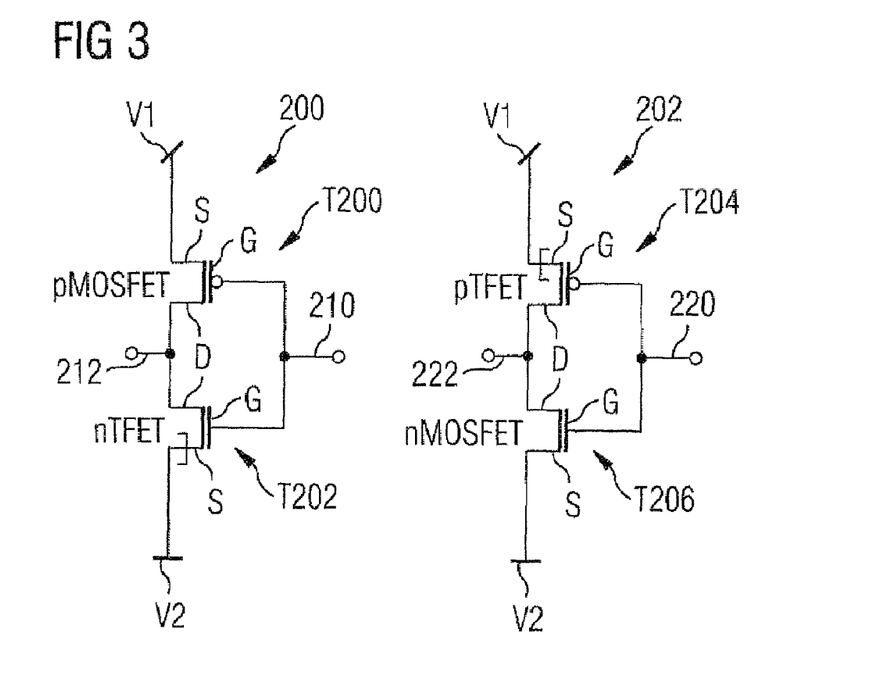
FIG. 3 illustrates two further possibilities for inverter circuits.

FIG. 3 thus illustrates two further possibilities for inverter circuits 200 and 202. The inverter circuit 200 contains a p-channel field effect transistor T200, the source region S of which is doped in accordance with the same doping type as the drain region D of the field effect transistor T200, namely in accordance with the p doping type. Moreover, the inverter circuit 200 contains an n-channel tunnel field effect transistor T202, the drain region D of which is doped in accordance with a different doping type than the source region of the field effect transistor T202, e.g., the drain region D is n-doped and the source region S is p-doped. The operating paths of the transistors T200 and T202 are in turn connected in series. The source region S of the field effect transistor T200 is at a potential V1. The drain regions D of the transistors T200 and T202 are electrically conductively connected to one another and to an output line 212 of the inverter circuit 200. The source region S of the field effect transistor T202 is connected to a potential V2, which differs from the potential V1. The gate electrodes G of the field effect transistors T200 and T202 are electrically conductively connected to one another and to an input line 210 of the inverter circuit 200.

The inverter circuit 202 contains a p-channel tunnel field effect transistor T204, the source region S of which is doped in accordance with a different doping type than the drain region D of the field effect transistor T204, e.g., the source region S is n-doped and the drain region D is p-doped. Moreover, the inverter circuit 202 contains an n-channel field effect transistor T206, the source region S of which is doped in accordance with the same doping type as the drain region D of the field effect transistor T206, namely in accordance with the n doping type. The operating paths of the field effect transistors T204 and T206 are connected in series. The source region S of the field effect transistor T204 is at a potential V1. The drain region of the field effect transistor T202 and the drain region of the field effect transistor T206 are electrically conductively connected to one another and lead to an output line 222 of the inverter circuit 202. The source region S of the field effect transistor T206 is at a potential V2, which is different from the potential V1. The gate electrodes G of the field effect transistors T204 and T206 are electrically conductively connected to one another and to an input line 220 of the inverter circuit 202.

The inverter circuits 154, 156 explained with reference to FIG. 2 and also the inverter circuits 200 and 202 explained with reference to FIG. 3 are push-pull inverter circuits. The method of operation of the circuits is not changed by the use of tunnel field effect transistors T170 to T176, T202 and T204.

Figure 4:
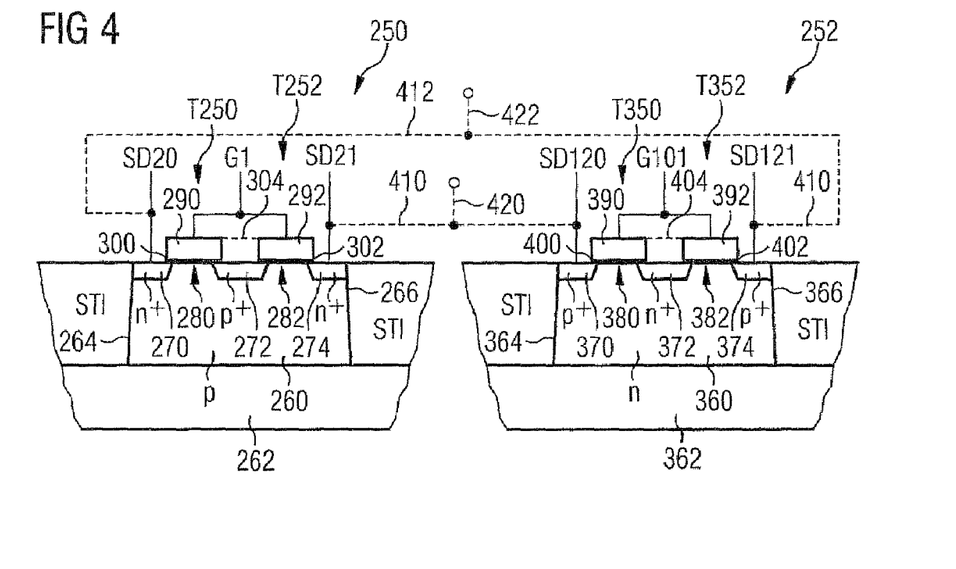
FIG. 4 illustrates two transmission gate branches which can be interconnected to form a transmission gate.

FIG. 4 illustrates two transmission gate branches 250, 252, which can also be interconnected to form a transmission gate. The transmission gate branch 250 contains two tunnel field effect transistors T250 and T252 whose operating paths are connected in series. A body region 260 of the transfer branch 250 includes e.g., lightly p-doped silicon. The body region 260 is bounded toward the bottom by a buried layer 262, which is n-doped, by way of example. As an alternative, an insulating layer is used instead of the buried layer 262, with the result that SOI transistors (silicon on insulator) arise. The body region 260 is laterally insulated by a left-hand isolating trench 264 and by a right-hand isolating trench 266. The isolating trenches 264 and 266 are also referred to as shallow isolating trenches (STI—Shallow Trench Isolation) and can also completely laterally enclose the body region 260. By way of example, the depth of the isolating trenches 264, 266 is in each case less than 1 micrometer or less than 1 nanometer. In the exemplary embodiment, the isolating trenches 264, 266 are filled with silicon dioxide.

The following were implanted in the body region 260:
a doping region 270 having a heavy n-type doping, i.e. an n$^+$-type doping,
a doping region 272 having a heavy p-type doping, and
a doping region 274 having a heavy n-type doping.

The doping region 270 is connected to one operating path connection SD20 of the transistor T250. The doping region 272 forms the other connection of the transistor T250. Moreover, the doping region 272 forms one connection region of the transistor T250. The doping region 274 of the transistor T252 is connected to one operating path connection SD21 of the transistor T252. A channel forming region 280 of the transistor T250 lies between the doping region 270 and the doping region 272. A channel forming region 282 of the transistor T252 lies between the doping regions 272 and 274.

Moreover, the transistor T250 contains a gate electrode 290, which is isolated from a channel forming region 280 of the transistor T250 by a gate dielectric 300. The transistor T252 contains a gate electrode 292, which is isolated from the channel forming region 282 of the transistor T252 by a gate dielectric 302. The channel forming regions 280 and 282 are formed in the body region 260. The gate electrodes 290 and 292 are electrically conductively connected to one another and connected to a gate connection line G1 of the transfer gate branch 250.

In an alternative exemplary embodiment, in order to decrease the required chip area, the gate electrodes 290 and 292 are formed as a common gate electrode 304, which also completely covers the doping region 272. However, the doping region 272 is made smaller than in the case of mutually separate gate electrodes. In this case, the gate dielectric 300 is also present continuously up to the gate dielectric 302.

The functioning of the transmission gate branch 250 is explained below. It is assumed that a positive potential is present at the operating path connection SD20 and that a ground potential is present at the operating path connection SD21. In this case, the p-n junction of the transistor T250 operates in the "reverse direction", with the result that, depending on the potential present at the gate electrode 290, a tunneling current flows through a tunnel junction that forms at the p-n junction of inversion channel and doping region 272. The transistor T252 operates in the forward direction, with the result that in the case of a positive gate potential, a current can flow through the transistor T252. The channels which form in the channel forming regions 280 and 282 are inversion channels in this case.

If, by contrast, a positive potential is present at the connection SD21 and a ground potential is present at the connection SD20, then the transistor T252 operates in the reverse direction, in which case, depending on the gate potential at the gate electrode 292, a tunneling current flows at a tunnel junction situated at the boundary between doping region 272 and the inversion channel in the channel forming region 282. In the case of these potentials, the transistor T250 operates in the forward direction, with the result that the transmission gate branch 250 conducts current or is switched on given a correspondingly large positive gate potential on the gate line G1.

In one exemplary embodiment, the transmission gate branch 250 is used instead of the transistor T150 in the drive circuit 100. For the rest, the circuit explained with reference to FIG. 2 is maintained in this exemplary embodiment. As an alternative, standard field effect transistors are used instead of the tunnel field effect transistors T170 to T176, in which case tunnel field effect transistors are used, however, instead of the transistor T150.

The transmission gate branch 252 is constructed like the transmission gate branch 250, and so mutually corresponding elements are designated by similar reference symbols. The value one hundred has in each case been added to the reference symbols of the transmission gate branch 250, however, in order to enable a differentiation. By way of example, a body region 360 in the transfer branch 252 corresponds to the body region 260 in the transfer branch 250. The following differences exist between the transmission gate branches 250 and 252:
the body region 360 is lightly n-doped, P1 the buried layer 362 is p-doped,
the doping region 370 is heavily p-doped,
the doping region 272 is heavily n-doped,
the doping region 374 is heavily p-doped.

For the rest, the transmission gate branches 250 and 252 match. Whereas the transmission gate branch 250 operates like an n-channel transistor in the case of a positive gate potential, the transmission gate branch 252 operates like a p-channel transistor in the case of a positive gate potential on account of the opposite doping types in mutually corresponding regions.

In a further exemplary embodiment, the connection SD21 of the transmission gate branch 250 and the connection SD120 of the transmission gate branch 252 are electrically conductively connected to one another via a connecting line 410. Moreover, the connection SD20 of the transmission gate branch 250 is connected to the connection SD121 of the transmission gate branch 252 via a connecting line 412. The connecting line 410 is connected to a switching element connection 420. The connecting line 412, by contrast, is connected to a switching element connection 422. The transmission gate including the transmission gate branches 250, 252 produces its switching function between the switching element connections 420 and 422. The transmission gate is controlled via the gate connection lines G1 and G101 that are controlled complementarily with respect to one another.

Figure 5:
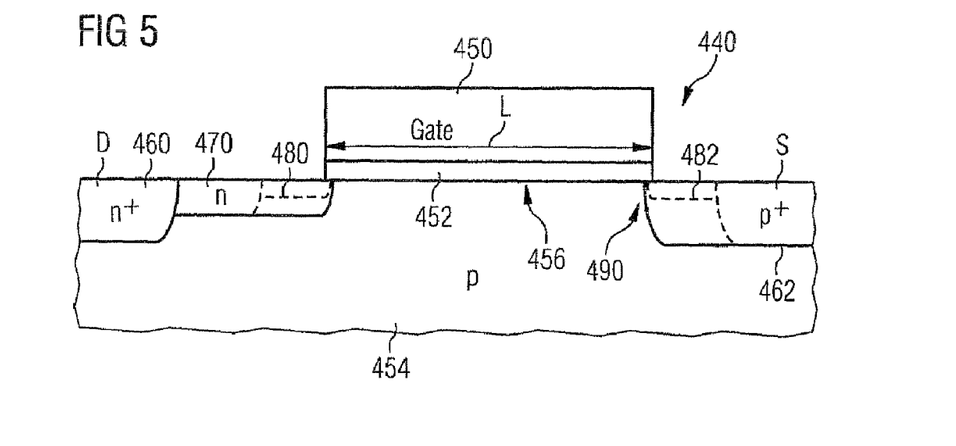
FIG. 5 illustrates a tunnel field effect transistor.

FIG. 5 illustrates a tunnel field effect transistor 440 containing a gate electrode 450 and a gate dielectric 452. The gate electrode 450 is composed for example of polycrystalline silicon that has been doped, or of metal. The gate electrode 450 has a gate length L, which approximately matches the channel length of the channel that forms. The gate dielectric 452 is composed for example of silicon dioxide having a layer thickness within the range of 10 nanometers to 25 nanometers, depending on the switching voltages which are switched by the transistor 440. In the exemplary embodiment, the thickness of the gate dielectric 452 is equal to 20 nanometers. The use of a different material for the gate dielectric results in other layer thicknesses, depending on the electrical properties of the dielectric. In addition, the thickness of the dielectric depends on the choice of gate material.

A substrate region 454 is weakly p-doped. A channel forming region 456 lies below the gate electrode 450 between a left-hand n-type doping zone (D, drain) and a right-hand p-type doping zone (S, source), the constituents of which are explained in more detail below. The left-hand doping zone D contains a main region 460 having, in accordance with a doping (diffusion or implantation), a maximum dopant concentration of between $10^{19}$ and $10^{20}$ dopant atoms per cm$^3$ (cubic centimeter). The right-hand doping region S likewise has a maximum dopant concentration of $10^{19}$ to $10^{20}$ dopant atoms per cm³. A higher dopant concentration can be achieved by the use of other materials for the drain and source regions (e.g., germanium). Whereas in one exemplary embodiment the region 462 reaches as far as the channel forming region 456, a drift region 470 produced in accordance with a further doping, the drift region being n-doped, also lies between the main region 460 and the channel forming region 456. The maximum doping of the drift region 470 is for example one power of ten less than the maximum doping in the main region 460. Moreover, the maximum dopant concentration in the main region 460 lies deeper in the substrate than the maximum dopant concentration in the drift region 470. In the case of the exemplary embodiment just explained, no additional doping zones, in particular no extension zones, are contained in the field effect transistor 440. The drift region 470 reaches in particular as far as the channel forming region 456. The drift region 470 is optional.

In an alternative exemplary embodiment, by contrast, the drift region 470 does not reach as far as the channel forming region 456. An extension region 480 produced in accordance with a third doping or a third doping process is arranged between the drift region 470 and the channel forming region 456, which extension region has been produced by using a further implantation process. The extension region 480 is n-doped. Its maximum dopant concentration is less than the maximum dopant concentration in the drift region 470. Moreover, the doping profile in the extension region 480 is formed more shallowly than the doping profile in the drift region 470. In this exemplary embodiment, the main region 462 is also arranged at a distance from the channel forming region 456. Situated between the main region 462 and the channel forming region 456 is a p-doped extension region 482, which has a maximum dopant concentration lower by one order of magnitude, for example, than the main region 462. The doping profile in the extension region 482 is moreover shallower than the doping profile in the main region 462.

The doping profiles explained with reference to FIG. 5 are also possible in the case of tunnel field effect transistors 440 which are used for switching voltages of greater than 5 volts, greater than 9 volts, greater than 12 volts or greater than 15 volts, but less than 30 volts, because a tunnel junction 490 forms at the doping region S and because an increased voltage drop occurs across the intrinsic or the weakly doped body region.

Figure 6A:
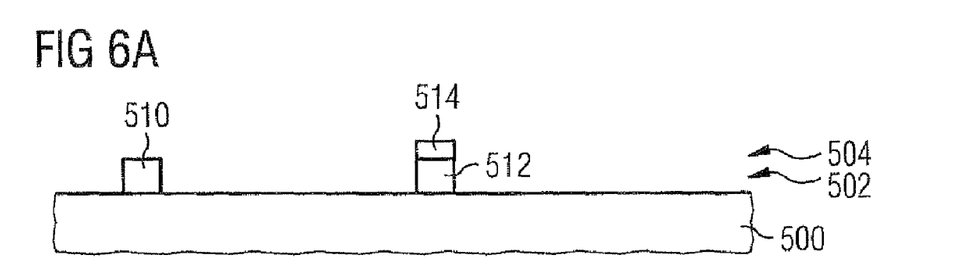
FIGS. 6A to 6C illustrate method processes for producing a tunnel field effect transistor.
Figure 6B:
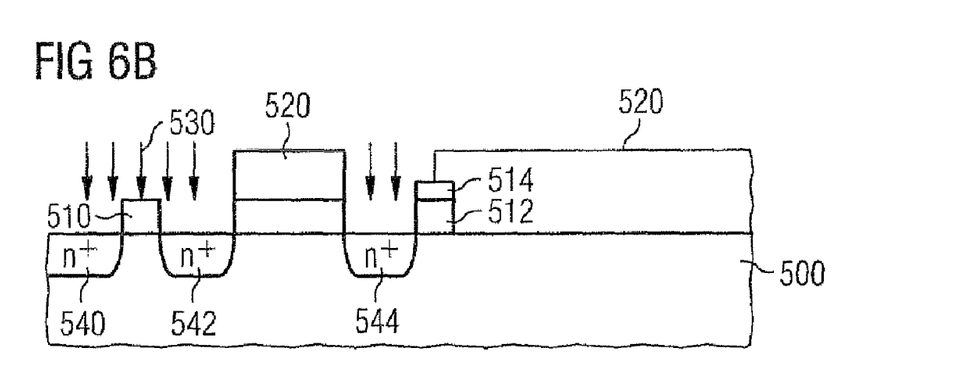
Figure 6C:
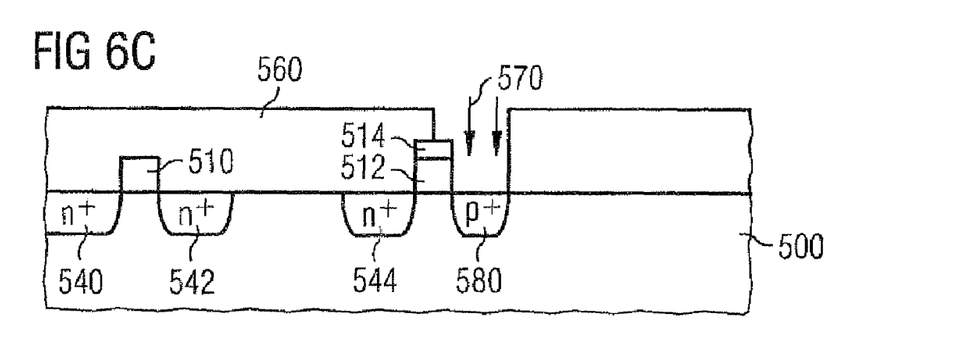

FIGS. 6A to 6C illustrate method processes for producing a tunnel field effect transistor together with a field effect transistor whose control path connection regions are doped in accordance with the same doping type. As illustrated in FIG. 6A, the starting point is formed by a substrate 500, for example by a monocrystalline silicon substrate. A gate dielectric layer (not illustrated), for example composed of silicon dioxide, is deposited on the substrate 500. A gate material layer 502, for example composed of doped polycrystalline silicon, is subsequently deposited over the whole area on the unpatterned gate dielectric layer.

As is illustrated in the left-hand part of FIG. 6A, with the aid of a standard hard mask layer or only with the aid of a photoresist, a gate electrode 510 is produced for a field effect transistor having drain-source regions of the same doping type. As is illustrated in the right-hand part of FIG. 6A, by contrast, with the aid of the hard mask layer whose material is different from the material of the hard mask layer for the gate electrode 510, a gate electrode 512 is produced, which is intended to become the gate electrode of a tunnel field effect transistor. After the removal of the photoresist, the hard mask region arranged, if appropriate, on the gate electrode 510 is also removed selectively with respect to a hard mask region 514 remaining on the gate electrode 512. By way of example, the hard mask layer region 514 is composed of silicon nitride.

As is further illustrated in FIG. 6B, a resist 520 is subsequently applied and patterned with the aid of a photolithographic method in such a way that openings for n-type doping regions 540 to 544 are produced. The gate electrode 510 is not covered by the resist 520, with the result that the implantation can be effected in self-aligning fashion with respect to the gate electrode 510. By contrast, the hard mask region 514 is partly covered with resist 520. This gives rise to a tolerance range during the patterning of the resist layer 520. Although the hard mask layer region 514 is partly covered by the resist 520, the implantation is likewise embodied in self-aligning fashion with regard to the hard mask region 514 or the gate electrode 512. The ion implantation of n-type dopants is illustrated by arrows 530 in FIG. 6B.

As is illustrated in FIG. 6C, the resist 520 is subsequently removed. Afterward, a resist 560 is applied and patterned with the aid of a photolithographic process in such a way that openings are produced in which p-type doping regions are intended to be produced, in particular a doping region 580. After the patterning, the resist 560 only partly covers the hard mask layer region 514. Comparatively low requirements are therefore made of the tolerances during the patterning of the resist 560. An ion implantation 570 is subsequently carried out in self-aligning fashion with respect to the hard mask region 514 or with respect to the gate electrode 512, the doping region 580 being produced.

The hard mask layer 514 is subsequently removed. A "conventional" field effect transistor has been produced in the region of the gate electrode 510, while a tunnel field effect transistor whose doping regions 544 and 580 are of the opposite doping type has been produced in the region of the gate electrode 512.

The doping profiles explained above with reference to FIG. 5 can be produced with the aid of spacer processes.

The tunnel field effect transistor produced with the aid of the method in accordance with FIGS. 6A to 6C is a quantum mechanical component which overcomes the scaling limits of a conventional MOSFET (Metal Oxide Semiconductor Field Effect Transistor). The operating principle of the tunnel field effect transistor is band-to-band tunneling at the junction between the channel and the source region. In the case of a positive gate bias, a channel is formed which results in a p+/n+ tunnel junction. In the case of a tunnel field effect transistor, the source and drain regions or, in particular, the source extensions and drain extensions, respectively, have to be doped in accordance with different doping types. The method explained with reference to FIGS. 6A to 6C prevents the gate electrode 512 from being multiply implanted. As a result, the work function of the gate electrode 512 can be set precisely. The consequence of this is that the threshold voltage of the tunnel field effect transistor can also be set precisely. The method illustrated with reference to FIGS. 6A to 6C is suitable in particular for gate lengths L of less than 500 nanometers. The production process for producing a standard transistor does not have to be altered since each additional process is compatible with the standard process. The principal idea consists in producing a hard mask region 514 prior to the etching of the gate electrode 512. The hard mask 514 is used in order to cover the gate material 512 and in order to protect it against a double or multiple implantation. The hard mask 514 can be removed by selective etching after the implantation of the source-drain regions or the extension regions.

Silicon dioxide or some other material can also be used as hard mask material of the hard mask 514. In one exemplary embodiment, the gate electrode 512 of the tunnel field effect transistor is doped prior to the etching of the gate electrode 512. In another exemplary embodiment, the gate electrode 512 is doped during the implantation of an extension region.

To summarize, it holds true that a high-voltage arrangement is specified which enables a high area density of flash memory components. Besides flash memories, the arrangement described can also be used for other high-voltage arrangements. In order to operate an EEPROM or FLASH memory, high electrical voltages are required for erasing and writing data in the memory cells. By way of example, the voltages are approximately 16 volts or they are even greater than 16 volts. The circuit arrangement for controlling the erase and write voltages must be able to switch the voltages without breakdowns occurring. Design rules are thus predefined which ensure the reliability of the drive circuit. The design rules relate in particular to the gate length, the insulating thicknesses, etc. The proportion of high-voltage circuit sections in the overall circuit is rising considerably in modern technology nodes, particularly in technology nodes smaller than 130 nanometers. The reason for this is the physical limits given, inter alia, for the insulations and for the channel length. This means that the main emphasis in the miniaturization of the memories which effect nonvolatile storage shifts from the memory cells to the memory periphery. Area savings on the basis of smaller memory cells are hardly possible any more. In addition, the process costs for decreasing the minimum feature size are no longer compensated for by the area reduction, with the result that the costs per chip would rise without the utilization of the invention.

A tunnel field effect transistor is used according to the invention in order to replace high-voltage transmission gates and other high-voltage circuits. On account of the p-i-n structure of the tunnel field effect transistor, the breakdown voltage is higher in comparison with standard field effect transistors. Even at a channel length of 300 nanometers, the breakdown voltage is greater than 10 volts. A standard field effect transistor would need a channel length of one micrometer for such a high breakdown voltage. Moreover, the leakage current of the tunnel field effect transistor is smaller in comparison with a standard field effect transistor, with the result that the power losses are reduced.

The tunnel field effect transistor operates asymmetrically with regard to the drain and source connections. This means that a transmission gate does not operate reliably if only one tunnel field effect transistor is used. As has been explained above with reference to FIG. 4, it is nevertheless possible to construct a transmission gate with tunnel field effect transistors which completely blocks or completely conducts. For high-voltage inverters, the asymmetry of the tunnel field effect transistors is not a problem since the drain-source voltage is always positive or always negative.

An integrated substrate contact of the tunnel field effect transistors, which inherently forms with a doped substrate, leads to a further reduction of the required chip area. The circuit arrangements according to the invention lead to a further saving of area and to a reduction of the power consumption e.g., in the high-voltage section of a flash memory. On account of the use of tunnel field effect transistors, there are other physical limits which require smaller dimensions in comparison with the dimensions hitherto set by physical limits. The invention once again enables further miniaturizations, e.g., in the peripheral circuit of flash memories.

In another exemplary embodiment, a transfer gate according to the invention or a latch according to the invention is used on a bit line of a nonvolatile memory cell.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a memory comprising:
    a drive circuit having at least one drive transistor comprising a tunnel field effect transistor having an electrically conductive control electrode, isolated from a channel forming region by a dielectric;
    a first doped connection region arranged at one end of the channel forming region, the connection region being doped in accordance with a first doping type; and
    a second doped connection region arranged at another end of the channel forming region, the connection region being doped in accordance with a second doping type, different from the first doping type,
    wherein the drive circuit includes a bistable multivibrator electrically connected to a word line.

2. The circuit of claim 1, comprising:
    memory cells having at least one transistor that contains a charge-storing layer that stores charges even after the operating voltage has been switched off.

3. The circuit of claim 1, comprising wherein the bistable multivibrator contains at least one tunnel field effect transistor.

4. The circuit of claim 3, comprising wherein the bistable multivibrator contains two inverters coupled to one another with positive feedback, and in that the inverters each contain at least one tunnel field effect transistor.

5. The circuit of claim 4, comprising wherein the inverters each contain a tunnel field effect transistor and a field effect transistor whose connection regions are doped in accordance with the same doping type, or the inverters each contain two tunnel field effect transistors.

6. The circuit of claim 5, comprising wherein the inverters each contain a p-channel field effect transistor and an n-channel field effect transistor;
    and in that the n-channel field effect transistor is a tunnel field effect transistor whose channel forming region is p-doped;
    and/or in that the p-channel field effect transistor is a tunnel field effect transistor whose channel forming region is n-doped.

7. The circuit of claim 1, comprising wherein the bistable multivibrator contains four field effect transistors, comprising:
    the drain region of a first p-channel field effect transistor and the drain region of a first n-channel field effect transistor, the gate electrode of a second p-channel field effect transistor and the gate electrode of a second n-channel field-effect transistor are electrically conductively connected to the word line;
    the drain region of the second p-channel field effect transistor, the drain region of the second n-channel field effect transistor, the gate electrode of the first p-channel field effect transistor and the gate electrode of the first n-channel field effect transistor are electrically conductively connected to one another;
    the source region of the first p-channel field effect transistor and the source region of the second p-channel field effect transistor are connected to one another; and the source region of the first n-channel field effect transistor and the source region of the second n-channel field effect transistor are connected to one another.

8. The circuit of claim 1, comprising wherein the bistable multivibrator is connected to a charge pump circuit.

9. An integrated memory circuit arrangement, comprising:
a multiplicity of memory cells which are arranged in matrix-type fashion in columns and rows and in each case contain at least one transistor or other memory element, comprising a plurality of word lines which in each case lead to memory cells of the same row, and comprising drive circuits which are arranged on the word lines and in each case contain a plurality of drive transistors;
wherein at least one drive transistor is a tunnel field effect transistor having an electrically conductive control electrode, which is isolated from a channel forming region by a dielectric;
wherein a first doped connection region is arranged at one end of the channel forming region of the tunnel field effect transistor, said connection region being doped in accordance with a first doping type;
and wherein a second doped connection region is arranged at another end of the channel forming region of the tunnel field effect transistor, said connection region being doped in accordance with a second doping type, which differs from the first doping type.

10. The circuit arrangement of claim 9, comprising wherein the memory cells are memory cells which effect non-volatile storage, wherein the memory cells each contain at least one transistor or that contains a charge-storing layer which stores charges even after the operating voltage has been switched off.

11. The circuit arrangement of claim 9, comprising wherein the drive circuits each contain a bistable multivibrator, which is electrically conductively connected to one of the word lines.

12. The circuit arrangement claim 11, comprising wherein the bistable multivibrator contains at least one tunnel field effect transistor.

13. The circuit arrangement of claim 12, comprising wherein the bistable multivibrator contains two inverters coupled to one another with positive feedback, and in that the inverters each contain at least one tunnel field effect transistor.

14. The circuit arrangement of claim 13, comprising wherein the inverters each contain a tunnel field effect transistor and a field effect transistor whose connection regions are doped in accordance with the same doping type, or in that the inverters in each case contain two tunnel field effect transistors.

15. The circuit arrangement of claim 14, comprising wherein the inverters each contain a p-channel field effect transistor and an n-channel field effect transistor;
and in that the n-channel field effect transistor is a tunnel field effect transistor whose channel forming region is p-doped;
and/or in that the p-channel field effect transistor is a tunnel field effect transistor whose channel forming region is n-doped.

16. The circuit arrangement of claim 11, comprising wherein the bistable multivibrator contains four field effect transistors, comprising:
the drain region of a first p-channel field effect transistor and the drain region of a first n-channel field effect transistor, the gate electrode of a second p-channel field effect transistor and the gate electrode of a second n-channel field-effect transistor are electrically conductively connected to the word line;
the drain region of the second p-channel field effect transistor, the drain region of the second n-channel field effect transistor, the gate electrode of the first p-channel field effect transistor and the gate electrode of the first n-channel field effect transistor are electrically conductively connected to one another;
the source region of the first p-channel field effect transistor and the source region of the second p-channel field effect transistor are connected to one another;
the source region of the first n-channel field effect transistor and the source region of the second n-channel field effect transistor are connected to one another.

17. The circuit arrangement of claim 11, comprising wherein the bistable multivibrator is connected to a charge pump circuit, including the source region of the two p-channel field effect transistors.

18. The circuit arrangement of claim 9, comprising wherein the drive circuits each contain a switching element circuit for bidirectional signal transmission or for isolating circuit sections having mutually different switching voltages, when the switching element circuit is preferably electrically conductively connected to a word line.

19. The circuit arrangement of claim 9, comprising wherein the switching element circuit contains at least one tunnel field effect transistor.

20. The circuit arrangement of claim 18, comprising wherein the switching element circuit contains at least two tunnel field effect transistors which contain a common control electrode or in each case a dedicated control electrode, wherein the two control electrodes are electrically conductively connected to one another; the two tunnel field effect transistors contain a common doped connection region or in each case a first doped connection region, wherein the first connection regions are electrically conductively connected to one another; the second connection region of one tunnel field effect transistor is connected to the word line; and the second connection region of the other tunnel field effect transistor is electrically conductively connected to a potential line which differs from the word line.

21. The circuit arrangement of claim 18, comprising wherein the switching element circuit contains two switching element branches which are connected in parallel and which are driven complementarily with respect to one another;
and in that one switching element branch contains at least one n-channel field effect transistor and the other switching element branch contains at least one p-channel field effect transistor;
wherein only one switching element branch contains the two tunnel field effect transistors or wherein both switching elements in each case contain two tunnel field effect transistors.

22. The circuit arrangement of claim 21, comprising wherein at least one tunnel field effect transistor or all of the tunnel field effect transistors have an asymmetrical doping profile of the two connection regions.

23. The circuit of claim 22, comprising wherein one connection region contains a main region having a high maximum dopant concentration;
one connection region contains, between the main region and the channel forming region, a drift region having a maximum dopant concentration which is less than the maximum dopant concentration of the main region, wherein the drift region reaches as far as the channel forming region; and the other connection region contains a further main region reaching as far as the channel forming region and having a high maximum dopant concentration.

24. The circuit arrangement of claim 22, comprising wherein one connection region contains a main region having a high maximum dopant concentration;
- one connection region contains, between the main region and the channel forming region, a drift region having a maximum dopant concentration which is less than the high dopant concentration;
- one connection region contains, between the drift region and the channel forming region, an extension region, the maximum dopant concentration of which is less than the maximum dopant concentration in the drift region; and
- the other connection region contains a further main region reaching as far as the channel forming region and having a high maximum dopant concentration, or in that the other connection region contains a further main region having a high maximum dopant concentration and a further extension region arranged between the further main region and the channel connection region and reaching as far as the channel forming region, wherein both extension regions preferably have the same maximum dopant concentration.

25. A tunnel field effect transistor comprising:
- a gate length of less than 500 nanometers for the switching of voltages or for the isolation of voltages of greater than 5 volts.

26. The transistor of claim 25, comprising wherein the tunnel field effect transistor is used in an integrated circuit arrangement;
- or the tunnel field effect transistor is used in a switching element circuit for bidirectional signal transmission or for isolating circuit sections having mutually different switching voltages;
- or the tunnel field effect transistor is used in an inverter circuit.

27. The use of two tunnel field effect transistors in a switching element for bidirectional signal transmission or in a switching element which operates as an isolating circuit comprising:
- the two tunnel field effect transistors either have a common control electrode or
- wherein the two tunnel field effect transistors in each case have a dedicated control electrode which are electrically conductively interconnected;
- wherein the two tunnel field effect transistors either have a common first doped connection region or wherein the two tunnel field effect transistors in each case contain a first doped connection region which are electrically conductively interconnected, the first doped connection region being doped in accordance with a first doping type; and
- wherein the two tunnel field effect transistors each include a second doped connection region being doped in accordance with a second doping type different from the first doping type.

28. The transistor of claim 25, wherein the gate length is less than 500 nanometers for the switching of voltages or for the isolation of voltages of greater than 9 volts.

29. The transistor of claim 25, wherein the gate length is less than 300 nanometers for the switching of voltages or for the isolation of voltages of greater than 9 volts.

30. The transistor of claim 25, wherein the transistor comprises an asymmetrical doping profile.

\* \* \* \* \*